United States Patent [19]

Bergeron

[11] Patent Number: 4,547,793
[45] Date of Patent: Oct. 15, 1985

[54] TRENCH-DEFINED SEMICONDUCTOR STRUCTURE

[75] Inventor: David L. Bergeron, Winooski, Vt.

[73] Assignee: International Business Machines Corporation, Armonk, N.Y.

[21] Appl. No.: 565,678

[22] Filed: Dec. 27, 1983

[51] Int. Cl.$^4$ .................... H01L 27/04; H01L 27/12; H01L 29/72; H01L 29/06
[52] U.S. Cl. ...................................... 357/50; 357/49; 357/48; 357/35; 357/55
[58] Field of Search ..................... 357/50, 55, 35, 48, 357/49

[56] References Cited

U.S. PATENT DOCUMENTS

| | | | |
|---|---|---|---|
| 3,385,729 | 5/1968 | Larchian | 117/200 |
| 3,919,005 | 11/1975 | Schinella et al. | 357/50 |
| 4,048,649 | 9/1977 | Bohn | 357/43 |
| 4,076,556 | 2/1978 | Agraz-Guerena et al. | 148/1.5 |
| 4,110,779 | 8/1978 | Rathbone et al. | 357/34 |
| 4,115,797 | 9/1978 | Hingarh et al. | 357/46 |
| 4,137,109 | 1/1979 | Aiken et al. | 148/175 |
| 4,174,252 | 11/1979 | Kressel et al. | 156/653 |
| 4,242,156 | 12/1980 | Peel | 148/175 |
| 4,283,236 | 8/1981 | Sirsi | 357/35 |
| 4,419,150 | 12/1983 | Soclof | 357/50 |

OTHER PUBLICATIONS

Schaible et al., IBM Technical Disclosure Bulletin, "Forming Sidewall Dielectric Isolation . . . ", Mar. 1975, pp. 2893-2894.
Antipov, IBM Technical Disclosure Bulletin, "Prevention of Birdsbeak Formation", Apr. 1981, pp. 4917-4919.

Primary Examiner—Martin H. Edlow
Assistant Examiner—Jerome Jackson
Attorney, Agent, or Firm—Stephen J. Limanek

[57] ABSTRACT

An improved device isolated by a trench formed in an N conductivity type semiconductor substrate is provided which has first and second spaced apart P conductivity type regions butted to a sidewall of the trench. An N+ doped region is disposed adjacent to the sidewall of the trench extending from the surface of the semiconductor substrate to an N+ buried region and interposed between the first and second P type conductivity regions. The dopant concentration in the N+ doped region is higher than that of the semiconductor substrate but not higher than the dopant concentration of the N+ buried region. More particularly, a lateral PNP transistor, isolated within a trench formed in an N type conductivity semiconductor substrate having an N+ buried region, has emitter and collector regions butted against a sidewall of the trench, along with the transistor's base region. A highly doped N+ base segment is disposed within the base region of the transistor adjacent to the sidewall of the trench extending from the surface of the substrate to the N+ buried region, and interposed between the emitter and collector regions.

15 Claims, 4 Drawing Figures

TRENCH-DEFINED SEMICONDUCTOR STRUCTURE

TECHNICAL FIELD

This invention relates to integrated semiconductor devices and more particularly to bipolar transistors isolated by a trench or groove formed within a semiconductor substrate.

BACKGROUND ART

Trenches formed in semiconductor substrates, e.g., silicon, filled with an insulating material, such as polyimide, for electrically isolating devices, e.g., transistors in integrated circuits have been known to provide significant device or transistor density improvements over other known isolation techniques. However, it has been found that some devices when isolated by a trench encounter reliability problems, such as undesirable variable current-voltage (I-V) characteristics.

The trench technology has been disclosed in, e.g., IBM Technical Disclosure Bulletin, Vol. 23, No. 11 April, 1981, pp. 4917-4919 which teaches filling a trench with silicon dioxide and silicon nitride. Filling a V-groove trench with polyimide is taught in IBM Technical Disclosure Bulletin, Vol. 17, No. 10 March, 1975, pp. 2893-2894.

U.S. Pat. No. 3,385,729, filed on Oct. 25, 1964, by G. A. Larchian, discloses an isolation trench having a sidewall covered first with a layer of silicon dioxide and then with a layer of silicon nitride, and U.S. Pat. No. 4,242,156, filed on Oct. 15, 1979, by J. L. Peel, teaches the formation of a silicon nitride layer over a silicon dioxide layer on a sidewall to prevent oxide breakdown.

In U.S. Pat. No. 4,048,649, filed on Feb. 6, 1976, by R. Bohn, there is shown a base of a transistor butted against a V-groove trench lined with a layer of silicon dioxide on which is formed a layer of silicon nitride, and in U.S. Pat. No. 4,174,252, filed on July 26, 1978, by H. Kressel et al, there is disclosed an emitter of a transistor protected on a sidewall by a layer of oxygen doped polysilicon over which is formed a layer of silicon nitride with a contact opening formed in the central portion of the top surface of the emitter.

An emitter of a transistor butted against a silicon dioxide region with an emitter contact overlapping the silicon dioxide region is illustrated in U.S. Pat. No. 4,110,779, filed on Dec. 13, 1976, by R. Rathbone et al.

U.S. Pat. No. 4,115,797 filed Oct. 4, 1976, by H. K. Hingarh et al discloses a lateral PNP transistor with an N+ diffusion region defining the N dopant concentration in the PNP base region.

U.S. Pat. No. 4,137,109 filed Feb. 3, 1977, by J. G. Aiken et al discloses trench isolation sidewalls butted by heavily doped channel stop P+ regions. The sidewall channel stops prevent surface inversion leakage.

Commonly assigned co-pending patent application having Ser. No. 468,442, filed Oct. 5, 1983, by D. G. Chesebro and F. J. Soychak, teaches a process and structure, which includes an emitter butted to a trench, wherein shorting of the emitter is avoided.

U.S. Pat. No. 4,076,556 filed June 1, 1976, by J. Agraz-Guerena et al, discloses an N+ region at the surface of a semiconductor substrate within an N base region of a lateral PNP transistor for improving the electrical characteristics of the lateral transistor.

DISCLOSURE OF THE INVENTION

It is an object of this invention to provide an improved semiconductor device isolated by a trench which has high reliability, particularly improved I-V characteristics between two trench defined adjacent P regions, such as stability.

In accordance with the teachings of this invention, an improved device isolated by a trench formed in an N conductivity type semiconductor substrate is provided which has first and second spaced apart P conductivity type regions butted to a sidewall of the trench, along with a substrate region defined by the first and second P regions. A highly doped N+ segment is disposed within the defined substrate region adjacent to the sidewall of the trench extending from the surface of the semiconductor substrate to an N+ subcollector region and interposed between the first and second P conductivity type regions. More particularly, a lateral PNP transistor, isolated within a trench formed in an N conductivity type semiconductor substrate having an N+ buried region, has emitter and collector regions butted against a sidewall of the trench, along with the transistor's base region. A highly doped N+ base segment is disposed within the base region of the transistor adjacent to the sidewall of the trench extending from the surface of the substrate to the N+ buried region, and interposed between the emitter and collector regions.

The foregoing and other objects, features and advantages of the invention will be apparent from the following and more particular description of the preferred embodiments of the invention, as illustrated in the accompanying drawings.

BEST MODE FOR CARRYING OUT THE INVENTION

Figure 1:
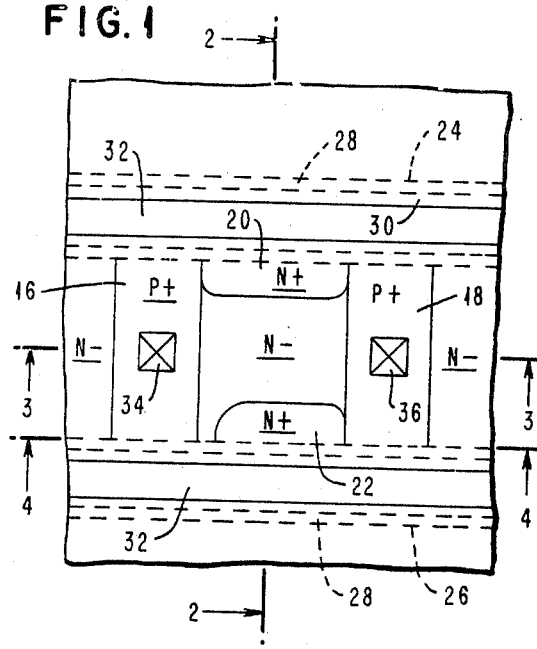
FIG. 1 is a plan view of a lateral PNP transistor structure taught by the present invention.

Referring to the drawings in more detail, there is illustrated in FIGS. 1, 2, 3 and 4 a lateral PNP transistor structure made in accordance with the teachings of the present invention.

Figure 2:
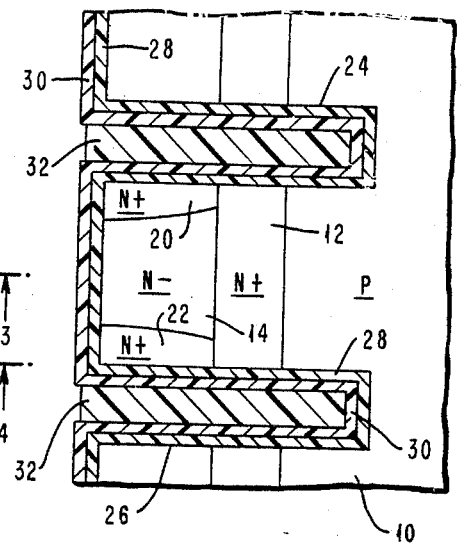
FIG. 2 is a sectional view of the transistor structure of FIG. 1 taken through line 2—2 thereof.
Figure 3:
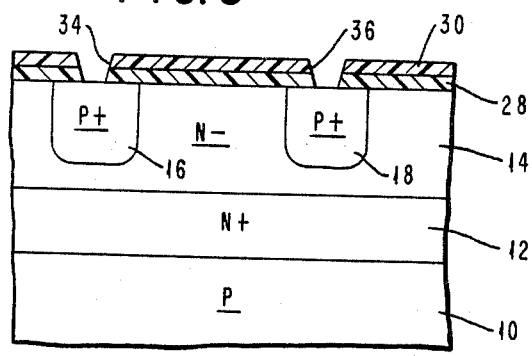
FIG. 3 is a sectional view of the transistor structure of FIG. 1 taken though line 3—3 thereof.
Figure 4:
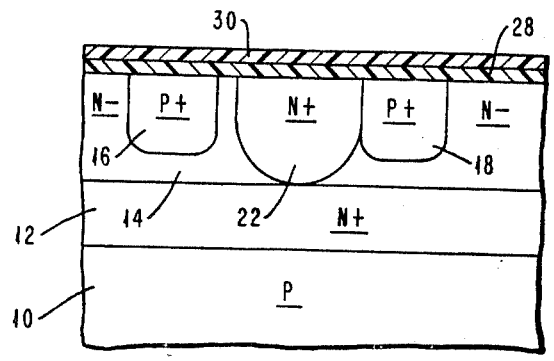
FIG. 4 is a sectional view of the transistor structure of FIG. 1 taken through line 4—4 thereof.

The structure includes a semiconductor substrate 10 having a P conductivity type and an N+ subcollector region 12 over which there is grown an N− conductivity type epitaxial layer 14, as seen more readily in FIGS. 2, 3 and 4. First and second spaced apart P+ conductivity type regions 16 and 18 are formed within the epitaxial layer 14 by any conventional technique. It can be seen from FIGS. 3 and 4 that the P+ regions 16 and 18 extend from the surface of the epitaxial layer 14 toward the N+ buried region 12 but are spaced therefrom. Highly doped N+ segments 20 and 22 are introduced at spaced apart portions of the epitaxial layer 14 between the P+ regions 16 and 18, as seen in FIGS. 1, 2 and 4.

First and second trenches 24 and 26 are formed through end portions of regions 16, 18 and segments 20 and 22 extending through the epitaxial layer 14 and the N+ buried region 12 into the substrate 10, as seen in FIG. 2 of the drawings. A layer of silicon dioxide 28 is grown within the trenches 24 and 26 and on the surface of the epitaxial layer 14. A layer of silicon nitride 30 is then deposited over the silicon dioxide layer 28. A suitable insulator, preferably polyimide 32, is introduced into the trenches 24 and 26 to completely fill the trenches, as shown in FIGS. 1 and 2. Openings 34 and 36, shown in FIGS. 1 and 3, are made in the silicon dioxide and silicon nitride layers 28 and 30 to provide for electrical contact with the P+ regions 16 and 18. It should be noted that P+ regions 16 and 18 form emitter and collector regions, respectively of a lateral PNP transistor, with the N− region located therebetween being the transistor base.

It should be understood that without the highly doped N+ segments 20 and 22 excessive leakage often occurs between the two adjacent butted P regions 16 and 18 when operated at elevated temperatures and voltages. This excessive leakage limits reliable device operation and is a direct result of net negative charge formation in the polyimide 32. The negative charge buildup in the polyimide 32 is a result of OH− anion movement and polyimide polarization which accumulates with time and temperature, and ultimately inverts the N− epitaxial layer 14 between the two adjacent butted P regions.

The N+ segments 20 and 22 disposed between the P regions 16 and 18 prevent inversion along the trench sidewall by raising the effective electron concentration at the trench sidewall to a level insensitive to the net negative charge buildup in the polyimide 32.

In a preferred embodiment of this invention, assuming a typical 5 volt power supply, the various layers and regions have the following thicknesses, dopants and doping concentrations. The boron doped P substrate 10 has a resistivity of 10–20 ohm-centimeters. The arsenic doped N+ buried region 12 has a maximum dopant concentration of $1-2\times 10^{20}$ atoms per cubic centimeter with a thickness of 2–3 microns. The P+ regions 16 and 18 are typically boron diffusions with a Co, i.e., maximum concentration at the surface, of $3\times 10^{18}$ atoms per cubic centimeter and a 0.75 micron junction depth. The arsenic doped N− epitaxial layer 14 has a Co of $2\times 10^{16}$ atoms per cubic centimeter and a thickness of 1.25 microns. The silicon dioxide layer 28 is 0.05–0.20 microns thick and the silicon nitride layer 30 is 0.05–0.08 microns thick. The spacing between the two adjacent butted P regions 16 and 18 is typically 0.5–1.5 microns for a 5 volt operation. The phosphorus doped N+ regions 20 and 22 have a Co of $5\times 10^{18}$ atoms per cubic centimeter and extend to the buried N+ region 12, i.e., its junction depth exceeds 1.25 microns.

For power supply applications exceeding the typical 5 volt operation, the dopant concentration of the N+ segments 20 and 22 must be increased to prevent inversion along the trench sidewall. This is done to compensate for the increase in the net negative charge that occurs in polyimide 32 at these higher operating voltages.

Reliable device operation of the structure discussed in the preferred embodiment has been observed on devices designed with the N+ segments 20 and 22. Leakage levels between the adjacent P regions 16 and 18 is 10,000 times less when N+ segments 20 and 22 are used in the PNP device operated at 5 volts and 125° C. In addition, the leakage level between the two P regions remains constant with time at operating voltages and temperatures when the N+ segments 20 and 22 are used in the PNP device design.

It can be seen that in accordance with the teachings of this invention a very reliable device, such as a lateral PNP transistor, has been provided which is significantly less sensitive to negative charges emanating from a trench and, thus, the device has a substantially constant I-V characteristic.

Although a lateral PNP transistor has been illustrated in the figures of the drawings, it should be understood that the invention is applicable to any device having a pair of spaced apart P regions butting the sidewall of a trench.

While the invention has been particularly shown and described with reference to preferred embodiments thereof, it will be understood by those skilled in the art that various changes in form and details may be made therein without departing from the spirit and scope of the invention.

What is claimed is:

1. A semiconductor structure comprising
a semiconductor substrate having an N type conductivity,
a trench formed within said substrate,
first and second spaced apart regions defining an N type conductivity region within said substrate, each of said first and second regions having a P type conductivity, being disposed at the surface of said substrate and having an end thereof butting said trench,
an insulating material disposed within said trench, and
an N+ layer disposed within said substrate and arranged substantially parallel to the surface of said substrate, said N+ layer being spaced from said first and second P regions, said N type region having an N+ segment disposed therein adjacent to said trench extending from the surface of said substrate to said N+ layer.

2. A semiconductor structure as set forth in claim 1 wherein said insulating material produces negative charges.

3. A semiconductor structure as set forth in claim 2 wherein said insulating material is polyimide.

4. A semiconductor structure comprising
a semiconductor substrate having a given type conductivity,
an epitaxial semiconductor layer having a conductivity type opposite to that of said substrate,
a buried semiconductor layer interposed between said substrate and said epitaxial layer and having said opposite type conductivity, said buried layer having a higher electrical conductivity than that of said epitaxial layer,
first and second substantially parallelly arranged trenches extending from the surface of said epitaxial layer through said buried layer into said substrate,
first and second spaced apart regions disposed within and at the surface of said epitaxial layer extending from said first trench to said second trench and having said given type conductivity,
a third region formed in said epitaxial layer interposed between and defined by said first and second regions having ends butted against said first and second trenches, and
an insulating medium disposed within said first and second trenches,
said third region including first and second segments disposed adjacent to said first and second trenches, respectively, and extending from the surface of said epitaxial layer to said buried layer, the electrical conductivity of each of said first and second segments being higher than that of the remaining portion of said third region.

5. A semiconductor structure as set forth in claim 4 wherein said insulating material is polyimide.

6. A semiconductor structure comprising a semiconductor substrate having a given type conductivity and a first impurity concentration, an epitaxial semiconductor layer having a conductivity type opposite to that of said substrate and a second impurity concentration, a buried semiconductor layer interposed between said substrate and said epitaxial layer and having said opposite type conductivity, said buried layer having a higher electrical conductivity than that of said epitaxial layer and a third impurity concentration, first and second substantially parallelly arranged trenches extending from the surface of said epitaxial layer through said buried layer into said substrate, first and second spaced apart regions disposed within and at the surface of said epitaxial layer extending from said first trench to said second trench and having said given type conductivity and a fourth impurity concentration, a third region disposed in said epitaxial layer and interposed between and defined by said first and second regions having ends butted against said first and second trenches, and an insulating medium disposed within said first and second trenches, said third region including first and second segments having a fifth impurity concentration disposed adjacent to said first and second trenches, respectively, and extending from the surface of said epitaxial layer to said buried layer, the electrical conductivity of each of said first and second segments being higher than that of the remaining portion of said third region, said fifth impurity concentration being significantly higher than that of said second impurity concentration.

7. A semiconductor structure as set forth in claim 6 wherein said insulating medium is polyimide.

8. A semiconductor structure as set forth in claim 7 wherein a layer of silicon dioxide is disposed within said trenches on the surfaces thereof.

9. A semiconductor structure as set forth in claim 8 wherein a layer of silicon nitride is disposed on said silicon oxide layer and said polyimide is disposed on said silicon nitride layer.

10. A semiconductor structure as set forth in claim 7 wherein said fifth impurity concentration is substantially equal to said third impurity concentration.

11. A semiconductor structure as set forth in claim 7 wherein said second impurity is arsenic having a maximum surface concentration of $2 \times 10^{16}$ atoms per cubic centimeter, said third impurity is arsenic having a maximum concentration of $1-2 \times 10^{20}$ atoms per cubic centimeter and said fifth impurity is phosphorous having a concentration of $5 \times 10^{18}$ atoms per cubic centimeter.

12. A semiconductor structure as set forth in claim 11 wherein said fourth impurity is boron having a maximum surface concentration of $5 \times 10^{18}$ atoms per cubic centimeter.

13. A PNP bipolar transistor structure comprising a semiconductor substrate having a buried region, a trench disposed within said substrate extending from the surface thereof through said buried region, a negative charge source disposed within said trench, and emitter, base and collector regions butted against said trench, said base region including an N+ doped segment disposed against said trench and extending from the surface of said substrate to said buried region, said N+ doped segment having a higher doping concentration than that of the principal portion of said base region.

14. A PNP bipolar transistor structure as set forth in claim 13 wherein said negative charge source is an insulating medium.

15. A PNP bipolar transistor structure as set forth in claim 14 wherein said insulating medium is polyimide.

* * * * *